(12) United States Patent
Johnson et al.

(10) Patent No.: US 10,851,937 B2
(45) Date of Patent: *Dec. 1, 2020

(54) MOUNTING BRACKET WITH SUPPORT STRUCTURE

(71) Applicant: Hubbell Incorporated, Shelton, CT (US)

(72) Inventors: Steven Johnson, Buchanan, MI (US); Krzysztof Korcz, Granger, IN (US)

(73) Assignee: Hubbell Incorporated, Shelton, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/179,505

(22) Filed: Nov. 2, 2018

(65) Prior Publication Data

US 2019/0137031 A1 May 9, 2019

Related U.S. Application Data

(60) Provisional application No. 62/581,177, filed on Nov. 3, 2017.

(51) Int. Cl.
| | | |
|---|---|---|
| *F16M 11/00* | (2006.01) |
| *F16M 13/02* | (2006.01) |
| *H02G 3/12* | (2006.01) |
| *F16M 11/04* | (2006.01) |
| *B21D 53/36* | (2006.01) |
| *H05K 7/14* | (2006.01) |
| *H05K 5/02* | (2006.01) |
| *F16M 11/08* | (2006.01) |
| *H02G 3/08* | (2006.01) |
| *H02G 3/10* | (2006.01) |
| *B21D 5/16* | (2006.01) |

(52) U.S. Cl.
CPC ............. *F16M 13/02* (2013.01); *B21D 53/36* (2013.01); *F16M 11/046* (2013.01); *F16M 11/08* (2013.01); *H02G 3/083* (2013.01); *H02G 3/12* (2013.01); *H02G 3/125* (2013.01); *H05K 5/02* (2013.01); *H05K 7/14* (2013.01); *B21D 5/16* (2013.01); *H02G 3/105* (2013.01)

(58) Field of Classification Search
CPC ........... H02G 3/125; H02G 3/126; H02G 3/18
See application file for complete search history.

(56) References Cited

U.S. PATENT DOCUMENTS

| 8,403,289 | B1* | 3/2013 | Rinderer | H02G 3/126 174/480 |
|---|---|---|---|---|
| 9,825,446 | B2* | 11/2017 | Korcz | H02G 3/125 |
| 10,256,613 | B2* | 4/2019 | Korcz | H02G 3/125 |
| 2006/0005987 | A1* | 1/2006 | Denier | H02G 3/18 174/58 |
| 2007/0187402 | A1* | 8/2007 | Dinh | H02G 3/126 220/3.9 |
| 2008/0029287 | A1* | 2/2008 | Korcz | H02G 3/126 174/58 |

(Continued)

*Primary Examiner* — Amy J. Sterling
(74) *Attorney, Agent, or Firm* — Michael Best & Friedrich, LLP

(57) ABSTRACT

A mounting bracket for supporting an electrical device includes a frame, a leg, and a support tab. The frame includes a rail and is configured to be secured to a structural support. The leg is connected to an edge of the rail and pivotable relative to the rail. The support tab is connected to the leg and configured to be coupled to the structural support.

21 Claims, 7 Drawing Sheets

(56) References Cited

U.S. PATENT DOCUMENTS

2016/0099555 A1\* 4/2016 Nikayin ................. H02G 3/125
  248/74.2
2017/0093141 A1\* 3/2017 Jones ..................... H02G 3/126

\* cited by examiner

MOUNTING BRACKET WITH SUPPORT STRUCTURE

REFERENCE TO RELATED APPLICATION

This application claims the benefit of prior-filed, U.S. Provisional Patent Application No. 62/581,177, filed Nov. 3, 2017, the entire contents of which are incorporate by reference.

BACKGROUND

The present disclosure relates to a mounting bracket, and more specifically to a mounting bracket with support tabs.

SUMMARY

In one aspect, a mounting bracket for supporting an electrical device includes a frame, a leg, and a support tab. The frame includes a rail and is configured to be secured to a structural support. The leg is connected to an edge of the rail at least during fabrication, the leg pivotable relative to the rail. The support tab is connected to the leg and configured to be coupled to the structural support.

In another aspect, a mounting bracket includes a frame and a support portion. The frame includes at least one rail, and each rail includes a mounting surface and a bend oriented at an angle relative to the mounting surface. The support portion includes a plate and a flange extending along an edge of the plate, and the flange is oriented at an angle relative to the plate.

In another aspect, a mounting bracket includes a frame, a support portion, and a support tab. The frame has a peripheral portion positioned around an opening, and the frame is configured to be secured to a structural support. The support portion is connected to an edge of the peripheral portion at least during fabrication and is pivotable relative to the peripheral portion. The support portion is configured to engage and retain at least one electrical cable. The support tab is connected to the support portion and is configured to be coupled to the structural support.

Other aspects of the disclosure will become apparent by consideration of the detailed description and accompanying drawings.

DETAILED DESCRIPTION

Before any embodiments are explained in detail, it is to be understood that the disclosure is not limited in its application to the details of construction and the arrangement of components set forth in the following description or illustrated in the following drawings. The disclosure is capable of other embodiments and of being practiced or of being carried out in various ways. Also, it is to be understood that the phraseology and terminology used herein is for the purpose of description and should not be regarded as limiting. Use of "including" and "comprising" and variations thereof as used herein is meant to encompass the items listed thereafter and equivalents thereof as well as additional items. Use of "consisting of" and variations thereof as used herein is meant to encompass only the items listed thereafter and equivalents thereof. Unless specified or limited otherwise, the terms "mounted," "connected," "supported," and "coupled" and variations thereof are used broadly and encompass both direct and indirect mountings, connections, supports, and couplings.

In general, the present disclosure relates to a mounting bracket for supporting an electrical box between support members or studs. The mounting bracket includes a portion for supporting electrical cables extending into the electrical box, and the portion can be secured to one or more of the support members.

Figure 1:
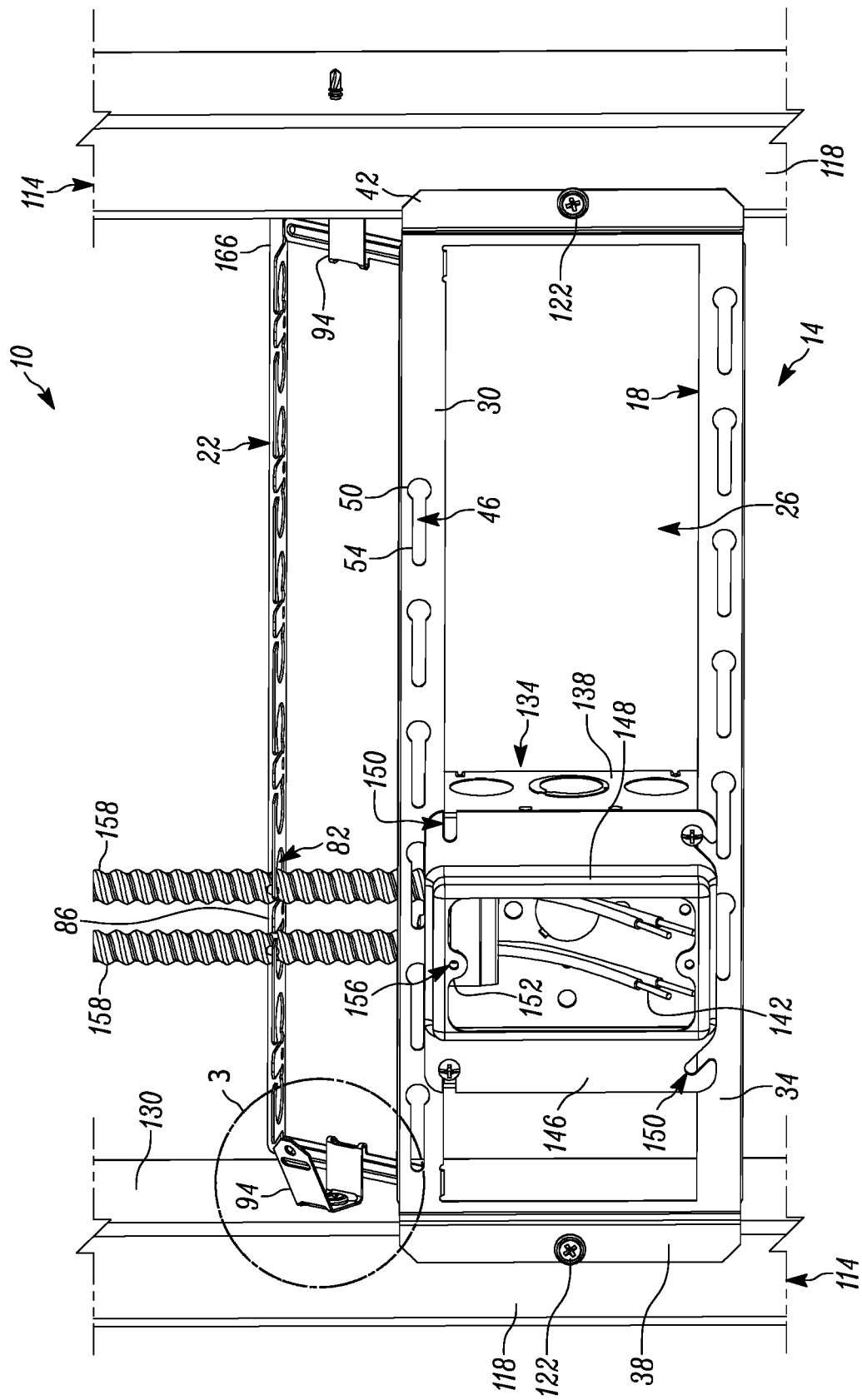
FIG. 1 is an elevation view of a mounting bracket.
Figure 2:
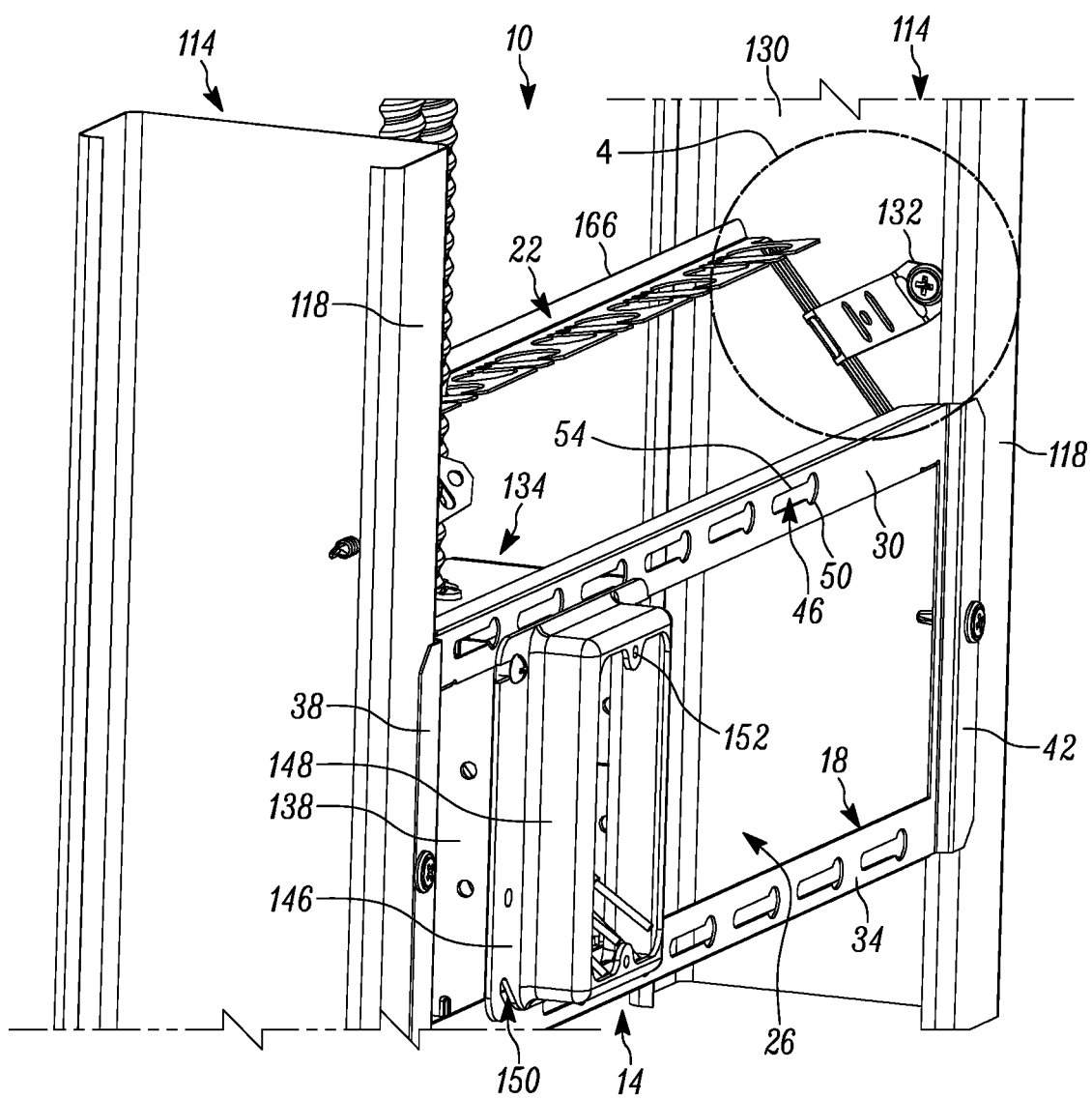
FIG. 2 is a perspective view of the mounting bracket of FIG. 1.

As shown in FIGS. 1 and 2, an electrical box support assembly 10 includes a mounting bracket 14 having a mounting portion or mounting plate 18 and a support portion 22. In the illustrated embodiment, the mounting bracket 14 is rectangular and includes an opening 26. A first rail 30 extends along an upper boundary of the opening 26, a second rail 34 extends along a lower boundary, and first and second mounting ends 38, 42 extend along the sides. The first and second rails 30, 34 each include a plurality of mounting features 46, such as keyhole slots having an enlarged opening 50 and an elongated portion 54. In the illustrated embodiment, the elongated portions 54 are oriented parallel to a direction of the first and second rails 30, 34.

Figure 5:
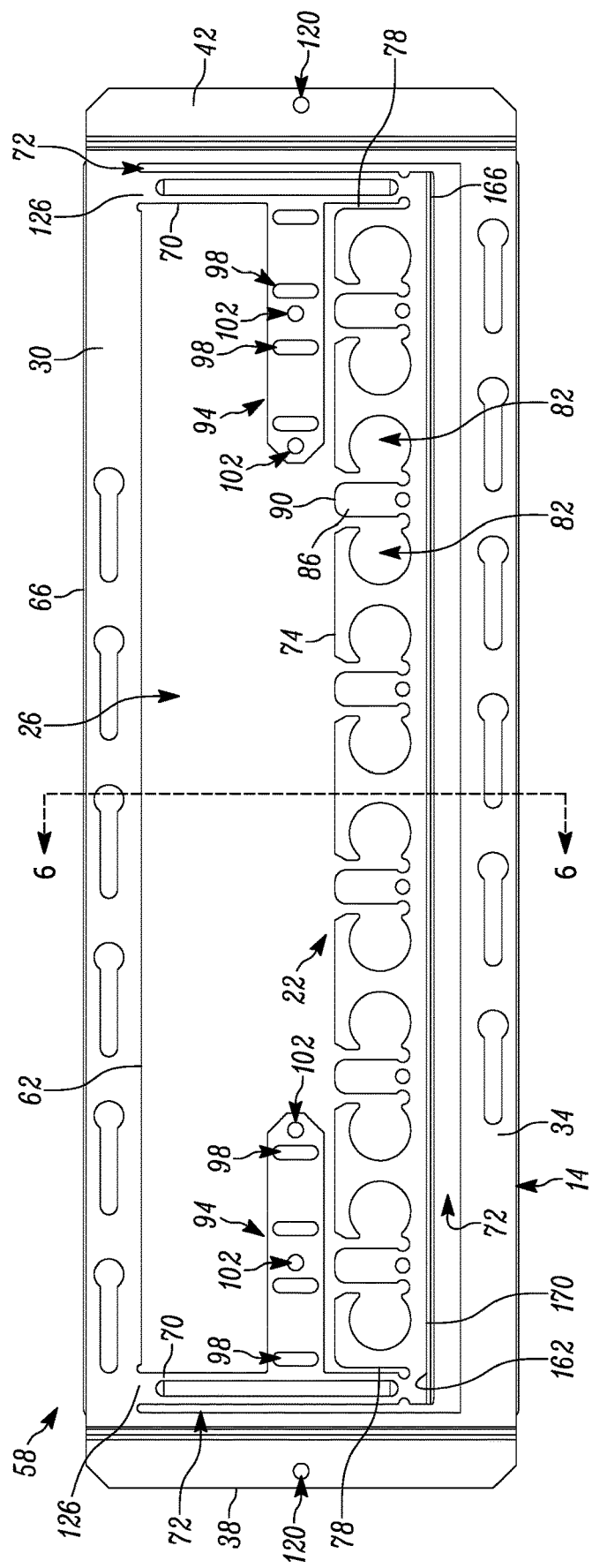
FIG. 5 is a plan view of a mounting bracket prior to installation.

As shown in FIG. 5, the mounting bracket 14 is formed (e.g., stamped or machined) from a blank. In the illustrated embodiment, the blank 58 is made from a single sheet of metal (e.g., aluminum, steel, brass, etc.) by stamping and cutting the sheet to the desired shape. The blank can be substantially flat initially, but one or more portions may be bent as desired.

The first rail 30 includes an inner edge 62 adjacent the opening 26 and an outer edge 66 opposite the inner edge 62. A pair of legs 70 extends from the inner edge 62 of the first rail 30. In the illustrated embodiment, one leg 70 is positioned proximate the first mounting end 38 and one leg 70 is positioned proximate the second mounting end 42. Prior to installation or bending, each leg 70 extends partially across the opening 26 toward the second rail 34. In the illustrated embodiment, each leg of the pair of legs 70 has a uniform width, and the legs are spaced apart from the mounting ends 38, 42 to form a gap 72 between each leg 70 and the respective mounting end 38, 42.

The pair of legs 70 extends and connects with the support portion 22. The support portion 22 extends between the legs 70. In some embodiments, the support portion 22 has a length less than the length of the first rail 30 or the second rail 34. The support portion 22 has an inner edge 74 and side edges 78 proximate the pair of legs 70. Each side edge 78 is spaced apart from each leg 70 so that a space exists between each leg 70 and the respective side edge 78. The support portion 22 is also spaced apart from the second rail 34.

The support portion 22 further includes cable openings 82 positioned along the inner edge 74. In the illustrated embodiment, the inner edge 74 of the support plate 22 is discontinuous and the cable openings 82 are not completely closed. The cable openings 82 are formed in pairs and each pair is separated by a tab 86. An edge 90 of each tab 86 is parallel to the inner edge 76.

The mounting bracket 14 further includes support tabs 94. In the illustrated embodiment, each support tab 94 is coupled to one of the legs 70. After the mounting bracket is formed but prior to installation, the support tabs 94 extend from an edge of the one of the pair of legs 70 toward the center of the opening 26. The support tabs 94 extend parallel to the first and second rails 30, 34. In the illustrated embodiment, each support tab 94 includes a plurality of apertures 98. The apertures 98 are spaced apart along the length of the support tabs 94. In the illustrated embodiment, the support tabs 94 also include two fastener apertures 102.

Figure 6:
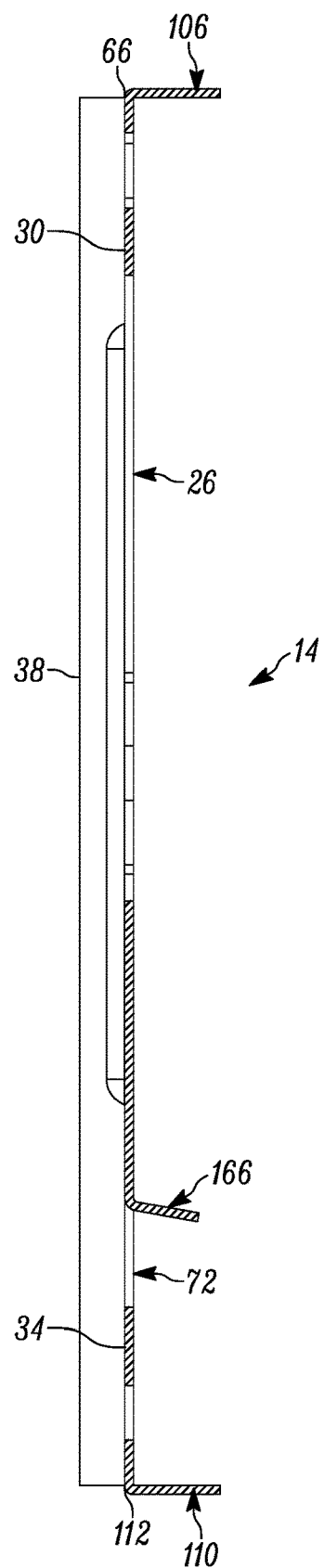
FIG. 6 is a cross-sectional view of the mounting bracket of FIG. 5, viewed along section 6-6.

As shown in FIG. 6, a first strengthening tab 106 is formed on the outer edge 66 of the first rail 30 and a second strengthening tab 110 is formed on an outer edge 112 of the second rail 34. In the illustrated embodiment each strengthening tab 106, 110 is oriented orthogonally to the respective rail 30, 34 (e.g., by bending). Forming the strengthening tabs 106, 110 orthogonally to the rails 30, 34 provides a simple feature and avoids more complicated fabrication operations (e.g., forming a jog bend). The strengthening tabs 106, 110 increase the strength and rigidity of the first and second rails 30, 34.

A third tab 166 is formed integrally with an outer edge 170 of the support plate 22. The outer edge is parallel to the inner edge 74. In the illustrated embodiment, the third tab 166 is a flat plate portion formed at an oblique angle with respect to the support portion 22. The flat plate provides a simple feature and avoids more complicated fabrication operations (e.g., forming a notched groove or rib). The third tab 166 extends along the length of the support plate 22 between the legs 70.

As shown in FIGS. 1 and 2, the mounting bracket may be secured between two studs or support members 114. In the illustrated embodiment, the rails 30, 34 are positioned in a plane that is offset from a plane of the mounting ends 38, 42. For example, a jog bend is positioned between the ends of the rails 30, 34 and an edge of the mounting ends 38, 42. A surface of each mounting end 38, 42 abuts a first surface 118 of each support 114. The jog bend abuts a surface of the support 114 perpendicular to the first surface 118 to prevent the mounting bracket 14 from shifting. The mounting ends 38, 42 each have a hole 120 (FIG. 5) configured to receive a fastener 122. The fasteners 122 extend through the holes 120 and into the first surface 118 of the support 114 in order to secure the mounting bracket 14 to the supports 114.

Figure 3:
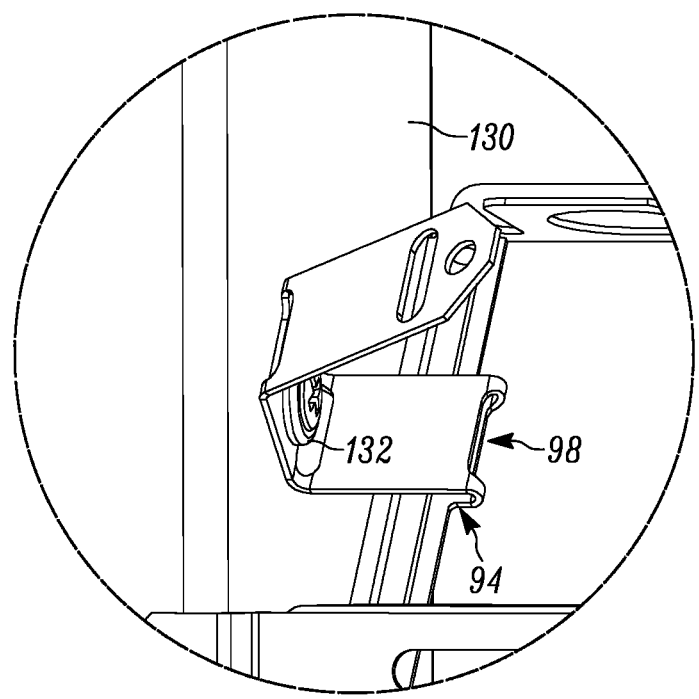
FIG. 3 is an enlarged view of section 3 of the mounting bracket of FIG. 1, showing a first supporting tab.
Figure 4:
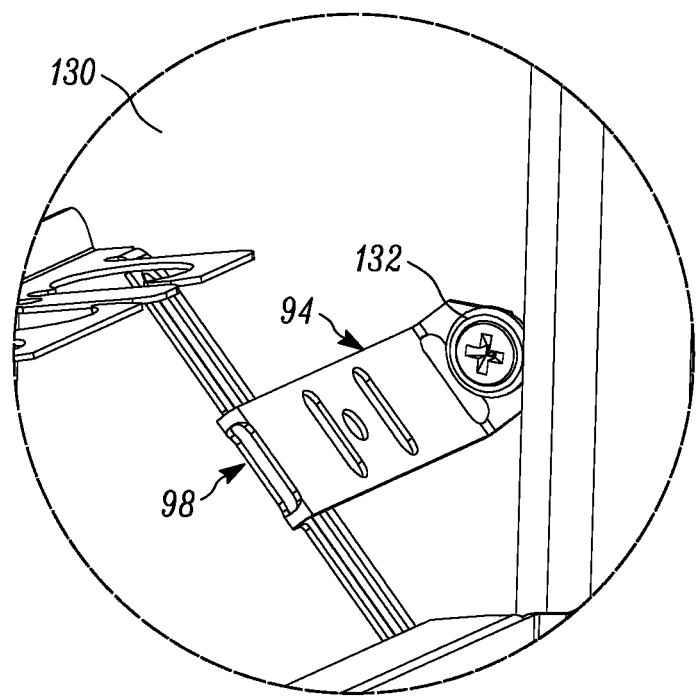
FIG. 4 is an enlarged view of section 4 of the mounting bracket of FIG. 1, showing a second supporting tab.

During installation, a user can bend the pair of legs 70 in order to reposition the support plate 22 out of the opening 26. Each leg 70 includes a fold line 126 (FIG. 5). The pair of legs 70 may bend together along the fold lines 126 in a first direction or a second direction (not shown). The gap 72 allows the pair of legs 70, the support plate 22, and the support tabs 94 to move relative the first rail 30 without contacting the second rail 34 or the first and second mounting ends 38, 42. Once the pair of legs 70 is positioned in a desired location, the support tabs 94 may bend so that they abut the second surface 130 of the respective support member 114 orthogonal the first surface 118 of the support member 114. The support tabs 94 are configured to bend around the apertures 98. As shown in FIGS. 3 and 4, the support tabs 94 bend about the aperture 98 proximate the leg 70 and bend again about another aperture 98 as necessary to position one of the fastening apertures 102 against the support member 114. Once the support tab 94 is bent so that a portion abuts the second surface 130, a fastener 132 is inserted through one of the two fastening apertures 102 to secure the support tab 94 to the second surface 130 of the support member 114. Securing the support tabs 94 to the support member 114 further secures the mounting bracket 14 to the support member 114.

After moving the pair of legs 70 from the opening 26, an electrical box 134 may be positioned within the opening 26. The electrical box 134 includes side walls 138 and a bottom wall 142. In the illustrated embodiment, the electrical box 134 is coupled to a base 146 with apertures 150. The apertures 150 are configured to receive fasteners 154 which extend through the apertures 150 and into the side walls 138 of the electrical box 134. The base 146 has a width greater than the width between the rails 30, 34 so the electrical box 134 may not pass entirely through the opening 26. A collar or mud ring 148 may be positioned adjacent an opposite side of the rails 30, 34 relative to the electrical box 134. The mud ring 148 and electrical box 134 may be coupled together around the rails 30, 34 (e.g., by fasteners) to secure and support the electrical box 134 between the studs 114. The mud ring 148 has a tab 152 with an aperture 156 that is configured to receive a fastener and secure a wiring device (not shown) to the mud ring 148.

In the illustrated embodiment, the fasteners 154 pass through the opening 26 although in other embodiments the electrical box 134 may be positioned so that the fasteners pass through the keyhole slots 46. In the illustrated embodiment, the opening 26 may be sized to receive and support one electrical box 134 (single gang—illustrated in FIG. 1) or two separate electrical boxes 134 (double gang).

As illustrated in FIG. 1, electrical wires extend into the electrical box 134. The electrical wires may be covered by a metallic sheath or shielded cable 158. The cable openings 82 of the support plate 22 receive the shielded cable 158. The support portion 22 has a fold line 162 along which the support portion 22 bends in either a first direction or a second direction (not shown). The third tab 166 provides structural support for the support portion 22 by providing a surface for the fold lines 162 to bend against. In the illustrated embodiment, the pair of legs 70 are bent in an opposite direction from the support portion 22. The support portion 22 is bent about the fold line 162 so that the cable openings 82 align with the shielded cable 158 extending from the electrical box 134. The space between each leg 70 and each side edge 78 allows the support plate 22 to bend relative to the pair of legs 70. The shielded cables 158 are each received within one of the cable openings 82. The tab 86 keeps the cable 158 in one cable opening 82 separate from a cable 158 in another cable opening 82.

The compact design provides a simpler manufacturing process for the mounting bracket and cable support, instead of requiring separate processes, tools, and material for each one. In addition, the mounting bracket and cable support can be maintained as one product, simplifying inventory maintenance.

Figure 7:
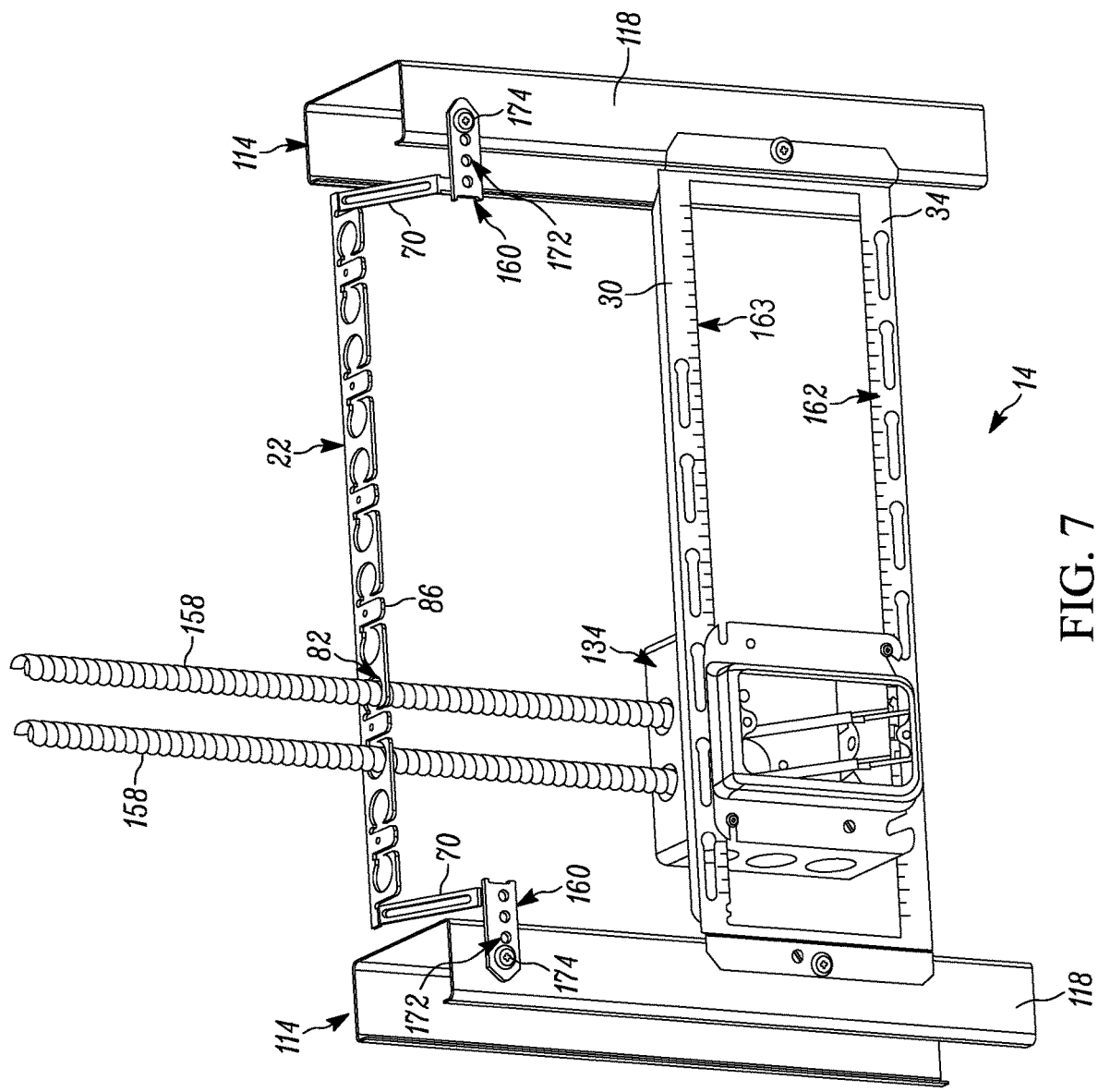
FIG. 7 is a perspective view of a mounting bracket according to another embodiment.
Figure 8:
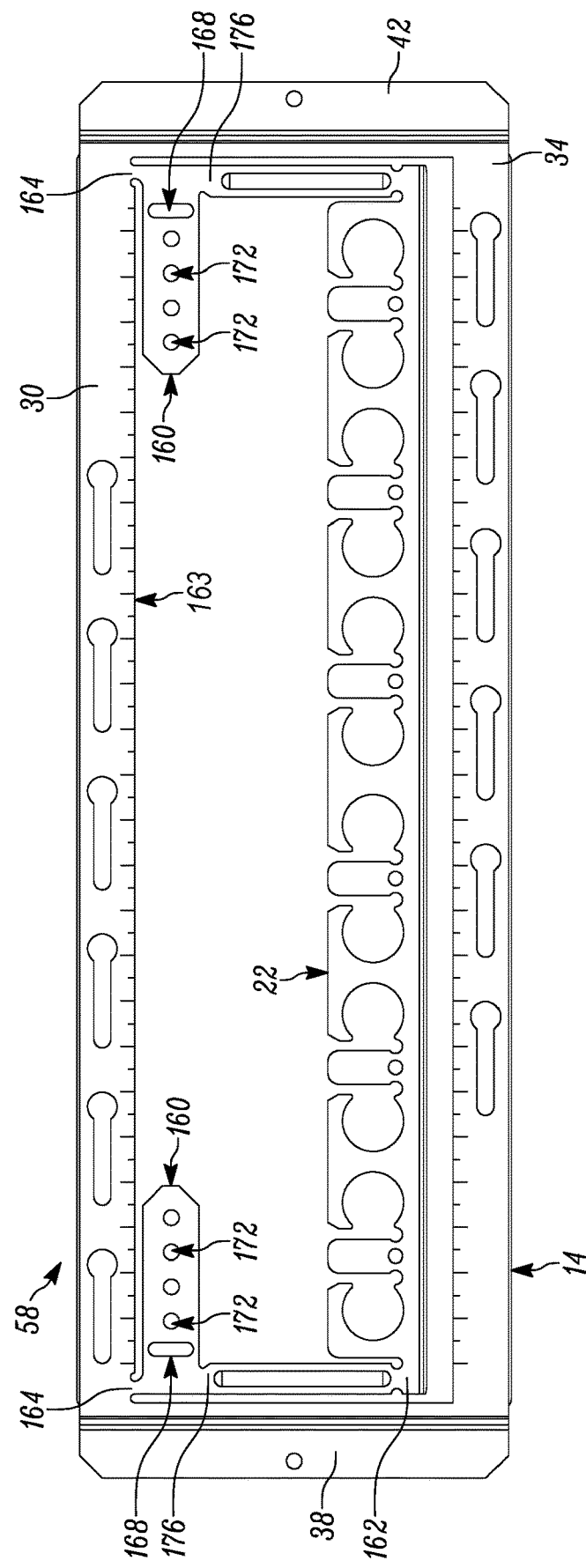
FIG. 8 is a plan view of the mounting bracket of FIG. 7 prior to installation.

FIG. 7 shows another embodiment of the mounting bracket 14. In this embodiment, the support tabs 160 are positioned on each leg 70 proximate an end of each leg 70. The pair of legs 70 is separable from the mounting bracket 14. Each leg 70 includes a frangible tab 164 (FIG. 8). The legs 70 may break away from the first rail 30 along the frangible tab 164 in a first direction or a second direction. In the illustrated embodiment, the first and second rails 30, 34 of the mounting bracket 14 include markings indicative of a measurement.

In the illustrated embodiment, each support tab 160 includes an aperture 168 and a plurality of fastening apertures 172 (FIG. 8). The support tabs 160, separated from the mounting bracket 14, bend about the aperture 168 as necessary to position one of the fastening apertures 172 against the support member 114. A fastener 174 is inserted through one of the fastening apertures 172 to secure the support tab 160 to the first surface 118 of the support member 114. The support tabs 160 may secure to the support members 114 a distance apart from the mounting bracket 14. Each leg 70 includes a fold line 176 (FIG. 8). The pair of legs 70 may bend together along the fold lines 176 in a first direction or a second direction (not shown). The pair of legs 70 and the support portion 22 bend about their respective fold lines 176, 162 so that the cable openings 82 align with the shielded cable 158 extending from the electrical box 134.

The embodiment(s) described above and illustrated in the figures are presented by way of example only and are not intended as a limitation upon the concepts and principles of the present disclosure. As such, it will be appreciated that variations and modifications to the elements and their configuration and/or arrangement exist within the spirit and scope of one or more independent aspects as described.

What is claimed is:

1. A mounting bracket for supporting an electrical device, the mounting bracket comprising:
   a frame including a rail configured to support the electrical device, the frame including an end portion configured to be secured to a structural support;
   a leg including a first end and a second end opposite the first end, the first end connected to an edge of the rail, the leg pivotable relative to the rail about the first end;
   a plate configured to engage an electrical cable, the plate connected to the second end of the leg; and
   a support tab connected to a lateral side of the leg between the first end and the second end of the leg, the support tab including a coupling portion configured to be coupled to the structural support and an intermediate portion connected between the coupling portion and the lateral side of the leg.

2. The mounting bracket of claim 1, wherein the leg is a first leg and the support tab is a first support tab, the mounting bracket further including a second leg including a first end and a second end opposite the first end, the first end connected to the edge and spaced apart from the first leg, the second leg pivotable relative to the rail about the first end of the second leg, a second support tab connected to a lateral side of the second leg between the first end and the second end of the second leg.

3. The mounting bracket of claim 1, further comprising a fold feature formed between the edge and the leg, the leg configured to bend about the fold feature.

4. The mounting bracket of claim 1, wherein an opening is positioned between the support tab and the leg, the support tab configured to bend about the opening relative to the leg.

5. The mounting bracket of claim 1, wherein the support tab includes a hole configured to receive a fastening member.

6. The mounting bracket of claim 5, wherein the hole is a first hole, the support tab further including a second hole configured to receive a fastener, wherein the support tab is bendable so that either the first hole or the second hole is adjacent a support surface.

7. The mounting bracket of claim 1, further comprising a fold feature formed on the leg proximate the support tab, the leg configured to bend about the fold feature relative the support tab.

8. A mounting bracket comprising:
   a frame including at least one rail, each rail including a mounting surface and a bend oriented at an angle relative to the mounting surface;
   a support portion for engaging an electrical cable, the support portion including a plate and a flange extending along an edge of the plate, the flange oriented at an angle relative to the plate;
   a plurality of legs connecting the frame to the support portion, each of the legs including a first end connected to an edge of the rail and a second end connected to the plate and spaced apart from the flange, the leg pivotable relative to the rail about the first end; and
   a support tab connected to a lateral side of one of the legs between the first end and second end of the respective leg, the support tab including a coupling portion configured to be coupled to the structural support and an intermediate portion connected between the coupling portion and the lateral side of the leg.

9. The mounting bracket of claim 8, wherein the plate includes an opening configured to receive an electrical cable, the opening formed along an edge of the plate opposite the flange.

10. The mounting bracket of claim 8, wherein a fold line is positioned between the plate and the flange, wherein the flange is formed by bending the flange relative to the plate about the fold line, the flange providing structural support to the support portion.

11. The mounting bracket of claim 8, wherein the support portion and the frame are configured to secure to a structural support, the support portion spaced apart from the frame.

12. A mounting bracket comprising:
   a frame having a peripheral portion positioned around an opening, the peripheral portion including at least one rail configured to support an electrical device, the frame including an end portion configured to be secured to a structural support;
   a support portion connected to an edge of the peripheral portion and pivotable relative to the peripheral portion, the support portion configured to engage and retain at least one electrical cable;
   a pair of legs, each leg including a first end connected to an edge of the rail and a second end connected to the plate, each leg pivotable relative to the rail about the respective first end; and
   a support tab connected to a side of one of the legs between the first end and second end of the respective leg, the support tab including a coupling portion configured to be coupled to the structural support and an intermediate portion connected between the coupling portion and the lateral side of the leg.

13. The mounting bracket of claim 12, wherein the leg integrally formed with an inner edge of the peripheral portion adjacent the opening, the leg configured to bend relative the frame, wherein the support tab is integrally formed on the leg and is configured to bend relative the leg, the leg and the support tab bendable in a first direction and a second direction transverse to the first direction.

14. The mounting bracket of claim 12, wherein the support tab is configured to be spaced apart from the frame while the support tab and the frame are coupled to the structural support.

15. The mounting bracket of claim 12, wherein the frame is formed from a metal sheet, wherein, prior to installation, the leg and the support tab are substantially planar with the frame but are bendable relative the frame.

16. The mounting bracket of claim 12, wherein the legs are moveable to allow an electrical box to be positioned within the opening and secured to the peripheral portion.

17. The mounting bracket of claim 12, wherein the frame is configured to couple to a first surface of a structural member, the support tab bendable to position a portion of the support tab against a second surface of the structural member.

18. The mounting bracket of claim 12, wherein the frame is supported between two structural members without any additional support coupled to a wall surface between the two structural members.

19. The mounting bracket of claim 12, further comprising a fold feature formed on the support portion proximate the support tab, the support portion configured to bend about the fold feature relative the support tab.

20. The mounting bracket of claim 1, wherein the support tab is bendable at multiple discrete locations.

21. The mounting bracket of claim 2, wherein the first support tab is attached to an inner edge of the first leg facing toward the second leg.

\* \* \* \* \*